United States Patent [19]

Nozawa et al.

[11] Patent Number: 5,539,179

[45] Date of Patent: Jul. 23, 1996

[54] ELECTROSTATIC CHUCK HAVING A MULTILAYER STRUCTURE FOR ATTRACTING AN OBJECT

[75] Inventors: Toshihisa Nozawa, Kobe; Junichi Arami, Tokyo; Shinji Kubota, Sagamihara; Isahiro Hasegawa, Zushi; Katsuya Okumura, Yokohama, all of Japan

[73] Assignees: Tokyo Electron Limited, Tokyo; Kabushiki Kaisha Toshiba, Kawasaki, both of Japan

[21] Appl. No.: 792,592

[22] Filed: Nov. 15, 1991

[30] Foreign Application Priority Data

Nov. 17, 1990 [JP] Japan .................................. 2-312479

[51] Int. Cl.$^6$ ..................................... B23K 10/00
[52] U.S. Cl. .............................. 219/121.43; 219/121.44; 219/121.58; 156/345; 279/128
[58] Field of Search ............................ 219/121.43, 121.4, 219/121.58; 156/345, 646; 279/128; 361/234

[56] References Cited

U.S. PATENT DOCUMENTS

| 4,724,510 | 2/1988 | Wicker et al. . | |
|---|---|---|---|
| 5,191,506 | 3/1993 | Logan et al. ............................. | 361/236 |

FOREIGN PATENT DOCUMENTS

| 0171011 | 12/1986 | European Pat. Off. . |
|---|---|---|
| 5690880 | 7/1981 | Japan . |
| 5690879 | 7/1981 | Japan . |
| 5764950 | 4/1982 | Japan . |
| 1284533 | 11/1989 | Japan . |
| 0294326 | 4/1990 | Japan . |
| WO79/00510 | 9/1979 | WIPO . |

OTHER PUBLICATIONS

Patent Abstracts of Japan, vol. 15, No. 383, (E–111), Sep. 27, 1991, & JP–A–3 152 953, Jun. 28, 1991, M. Nakasuji, et al., "Electrostatic Chuck".
Patent Abstracts of Japan, vol. 15, No. 94, (E–104), Mar. 6, 1991, & JP–A–2 304 946, Dec. 18, 1990, K. Tominaga, et al., "Electrostatic Chuck".
Patent Abstracts of Japan, vol. 8, No. 115 (E–247) [1552], May 29, 1984, & JP–A–59 028 354, Feb. 15, 1984, Y. Horiike, et al., "Thin Film for Electrostatic Chuck".
Patent Abstracts of Japan, vol. 14, No. 170, (E–91) Mar. 30, 1990 & JP–A–2 027 748, Jan. 30, 1990, T. Matsunaga, et al., "Electrostatic Chucking Device and Forming Method Therefor".
Patent Abstracts of Japan, vol. 8, No. 268, (E–283)[1705], Dec. 7, 1984, & JP–A–59 139 641, Aug. 10, 1984, M. Nakamura, et al., "Electrostatic Sucker".

*Primary Examiner*—Mark H. Paschall
*Attorney, Agent, or Firm*—Oblon, Spivak, McClelland, Maier & Neustadt

[57] ABSTRACT

An electrostatic chuck for electrostatically holding a wafer is provided in a vacuum chamber formed in a magnetron plasma etching apparatus. The electrostatic chuck has a base member, a first insulating layer provided on the base member and made of polyimide, a second insulation layer made of AlN, a conductive sheet provided between first and second insulation layers, and an adhesive layer made of a thermosetting resin and adhering the first insulating layer to the second insulating layer. The wafer is placed on the second insulating layer, and power is supplied from a high voltage power supply to the conductive sheet via a feeding sheet, thereby creating static electricity and hence a coulombic force for holding the wafer on the second insulating layer.

4 Claims, 5 Drawing Sheets

ELECTROSTATIC CHUCK HAVING A MULTILAYER STRUCTURE FOR ATTRACTING AN OBJECT

BACKGROUND OF THE INVENTION

1. Field of the Invention

This invention relates to an electrostatic chuck for use in a treatment apparatus such as a plasma etching apparatus to electrostatically hold an object such as a wafer by a coulombic force.

2. Description of the Related Art

In a plasma etching apparatus, for example, an electrostatic chuck is used to electrostatically hold an object such as a wafer.

The electrostatic chuck has an insulating layer and an electrode as basic constituents. An object to be chucked, for example a wafer is placed on the insulating layer. That is, the wafer is aligned with the electrode, with the insulation layer interposed therebetween. At this time, a voltage is applied between the wafer and electrode, thereby causing positive charge on one side and negative charge on the other side. Accordingly, a coulombic force is exerted therebetween, and the wafer is attracted onto the chuck.

For example, an electrostatic chuck is known which is provided with an electrostatic holding sheet having a conductive sheet made of copper and interposed between two insulation polyimide sheets formed on a base member. In this chuck, an object such as a wafer is placed on the holding sheet, and is electrostatically held by the holding sheet when a voltage is applied to the holding sheet by a high voltage power source via a feeding sheet formed integrally with the holding sheet.

This electrostatic sheet, however, will easily be broken since the polyimide insulation layer is formed thin so as to obtain a required coulombic force, and since polyimide itself has a low strength. Further, if the electric charge of the polyimide insulation sheet is removed by using plasma after the wafer is unloaded, the sheet will be damaged by the plasma. It is a great disadvantage of the above-described electrostatic chuck that the life of the polyimide used as an insulating layer is short.

Moreover, the temperature of a wafer is generally controlled via the base of the chuck. That surface of the wafer which is brought into contact with the insulation sheet is small since the wafer surface is uneven microscopically, and the thermal conductivity of polyimide is low. Thus, the thermal conductivity of the chuck is low, which makes it difficult to perform appropriate temperature control of the wafer. Therefore, in the electrostatic chuck, a clearance between the wafer and insulation sheet is filled with a gas under a predetermined pressure to obtain a good thermal conductivity. To obtain a sufficient thermal conductivity without using such a gas, the holding force of the holding sheet must be enhanced. However, it is difficult to do so in the case of the above electrostatic chuck employing an insulating sheet made of polyimide.

To overcome these disadvantages, such an electrostatic chuck has been made which employs an insulating sheet made of a ceramic material such as an alumina sintered body. This chuck is made by using a conventional method for producing a multi-layered ceramic substrate. Specifically, for example, an alumina substrate is formed on a base, and an alumina layer is formed on the substrate with a conductive tungsten pattern interposed therebetween. The electrostatic sheet thus constructed has a ceramic insulator, so that the chuck has a high durability and a high strength against plasma damage, i.e., it is not easily broken. In addition, the wafer-holding force of the chuck can be increased.

However, if electrostatic chucks are produced by mainly using a ceramic sintered body, the yield of the chucks will be low, and the cost thereof will be extremely high, due to distortion and the like caused by sintering.

SUMMARY OF THE INVENTION

It is an object of the invention to provide an inexpensive electrostatic chuck which is not easily broken.

It is another object of the invention to provide an inexpensive electrostatic chuck having a high holding force.

According to the invention, the electrostatic chuck for holding an object by coulombic force, comprises: a base member; a first insulating layer formed on the base member; a second insulating layer made of an inorganic dielectric material; an electrode provided between the first and second insulating layers or in the first insulating layer; and an adhesive layer made of an organic material for adhering the first insulating layer to the second insulating layer; wherein the object is placed on the second insulating layer, and a voltage is applied between the object and the electrode, thereby creating static electricity and hence a coulombic force for holding the object on the second insulation layer.

In the invention constructed as above, since the second insulating layer interposed between the object and electrode is made of an inorganic dielectric material, it has a good durability and a higher resistance against plasma shock than the conventional insulating layer made of polyimide. Thus, the second insulating layer is not easily broken even if it is thin. Moreover, the simple process in which the second insulating layer made of the inorganic dielectric material is formed on the first insulation layer with the adhesive layer interposed therebetween, enables electrostatic chucks to be produced with a high yield and at low cost. Further, the second insulation layer formed of the inorganic dielectric material enables the electrostatic chuck to have a great object-holding force, thereby facilitating the temperature control of the object.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Electrostatic chucks according to the embodiments of the present invention, which are used in a plasma etching apparatus, will be explained in detail with reference to the accompanying drawings.

Figure 1:
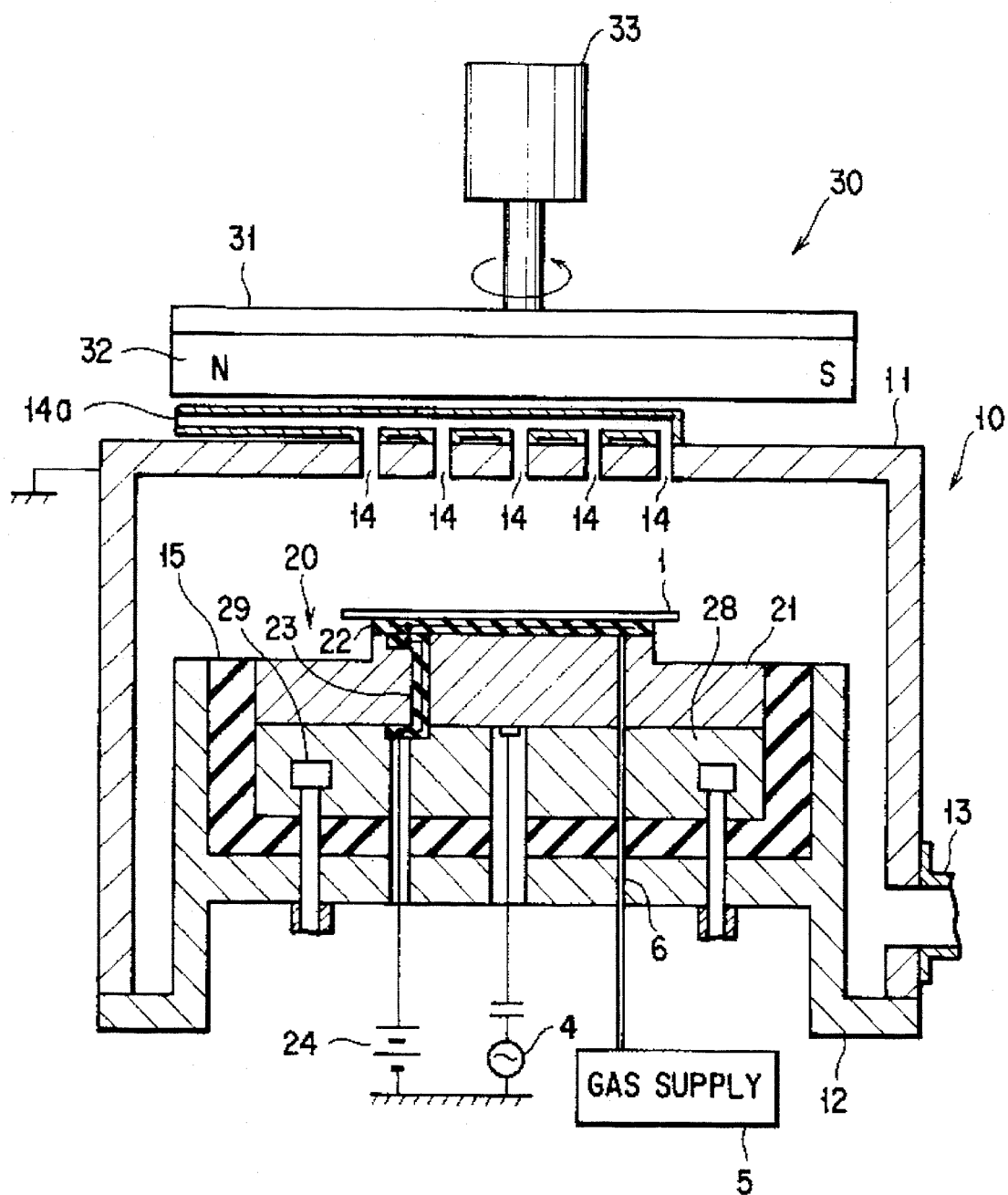
FIG. 1 is a schematic sectional view, showing a magnetron plasma etching apparatus employing an electrostatic chuck according to an embodiment of the present invention.

FIG. 1 is a schematic view of a plasma etching apparatus employing an electrostatic chuck according to an embodiment of the present invention. This device has a vacuum chamber 10, an electrostatic chuck 20 provided in the chamber 10 for electrostatically holding a wafer 1, a magnet section 30 provided above the chamber 10, and a RF power source 4.

The vacuum chamber 10 comprises an upper chamber structure 11 and a lower chamber structure 12. An exhaust port 13 is formed in a lower portion of the side wall of the upper chamber structure 11, through which gases in the chamber 10 are eliminated by an exhaust pump (not shown) connected to the port. The vacuum chamber 10 is designed such that pressure therein can be reduced down to approx. $10^{-6}$ Torr. A plurality of gas inlets for introducing etching gases in the chamber 10 are formed in the upper portion of the upper chamber structure 12. A gas supply pipe 14a, through which an etching gas is supplied from a gas supply source (not shown) to the chamber 10, is connected to the gas inlets 14.

The electrostatic chuck 20 has a base member 21 and an elastic electrostatic holding sheet 22 having a laminated structure, and is formed on a support member 28. The electrostatic holding sheet 22 is connected to a high voltage direct current power source 24 via a power supply sheet 23. The electrostatic chuck 20 will be explained in detail later.

A ceramic member 15 is interposed between the support member 28 and lower chamber structure 12, thereby electrically isolating them from each other. A fluid passage 29 is formed in the support member 28 for circulating a cooling fluid. The temperature of the wafer 1 is controlled by circulating a fluid, having a predetermined temperature, through the passage 29.

The base member 21 and support member 28 are made of, for example, aluminum.

A hole 6 extends through the chamber 10, ceramic member 15, support member 28, and electrostatic chuck 20. A heat-transfer gas such as He or $O_2$ is supplied from a gas supply source 5 through the hole 6. The gas is supplied between the electrostatic chuck 20 and wafer, thereby enhancing the thermal conductivity between the chuck 20 and wafer 1, and hence controlling the temperature of the wafer 1 accurately.

The high frequency power supply 4 is connected to the base member 21 of the electrostatic chuck 20, and the upper chamber structure 11 is grounded. Accordingly, when a high frequency power is supplied, the upper wall of the upper chamber structure 11 serves as the upper electrode, while the base member 21 serves as the lower electrode, thereby causing plasma to be formed therebetween.

The magnet section 30 applies a magnetic field between the electrodes, and comprises a support member 31 extending in the horizontal direction, a permanent magnet 32 supported by the support member 31, and a motor 33 for rotating them in the direction indicated by the arrow.

In the magnetron plasma etching device constructed as above, an etching gas is guided into the chamber 10, and etching is performed in a state where a high frequency power is applied between the upper and lower electrodes, and also a magnetic field perpendicular to the electric field generated between the electrodes is applied therebetween by rotating the permanent magnet 32. At this time, electrons generated between the electrodes perform cyclone movement. Since collision between the electrons and gas molecules accelerates electrolytic dissociation of the molecules, a high etching speed of 1 μm/min can be obtained even under a low pressure of $10^{-2}$ to $10^{-3}$ Torr. Thus, the time required for treating each wafer is short, and the reliability of etching is enhanced. Further, the average energy of the ions is low, which prevents the wafer from being significantly damaged.

Figure 2:
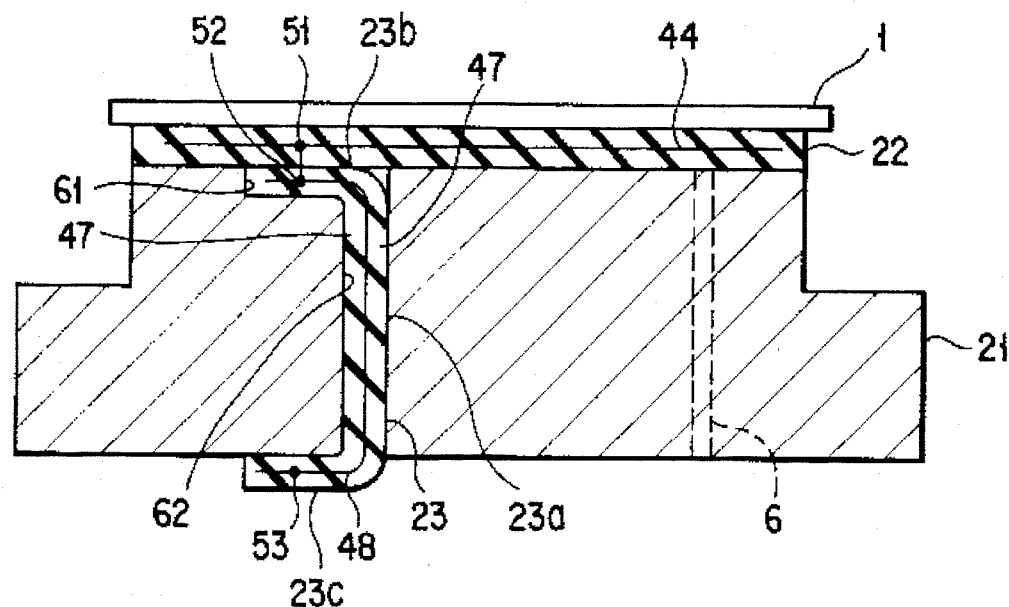
FIG. 2 is a sectional view, showing the electrostatic chuck of FIG. 1.

The electrostatic chuck 20 for electrostatically holding wafers will be explained in detail. FIG. 2 is a sectional view, showing the chuck 20. As mentioned above, the chuck 20 has the base member 21 and electrostatic holding sheet 22, which is connected to the power supply 24 via the feeding sheet 23.

Figure 3:
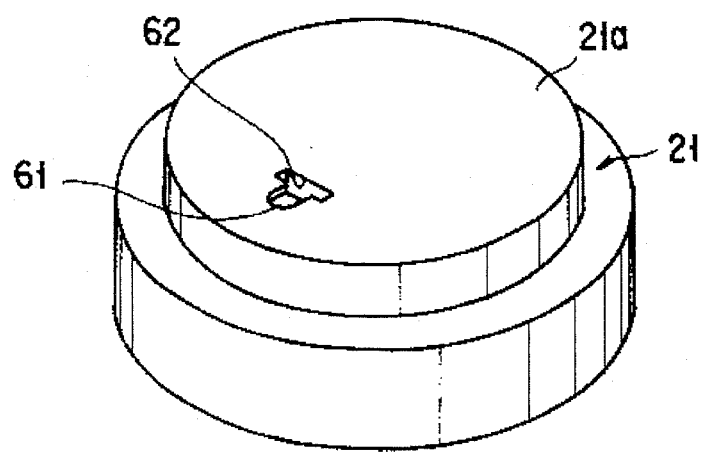
FIG. 3 is a perspective view, showing a base member employed in the electrostatic chuck of FIG. 1.

As is shown in FIG. 3, the base member 21 comprises a cylindrical body with a stepped portion. The stepped portion has an upper surface 21a provided with a depression 61 and a slit 62 for receiving the power supply sheet. The slit 62 extends to the bottom of the base member 21.

Figure 4:
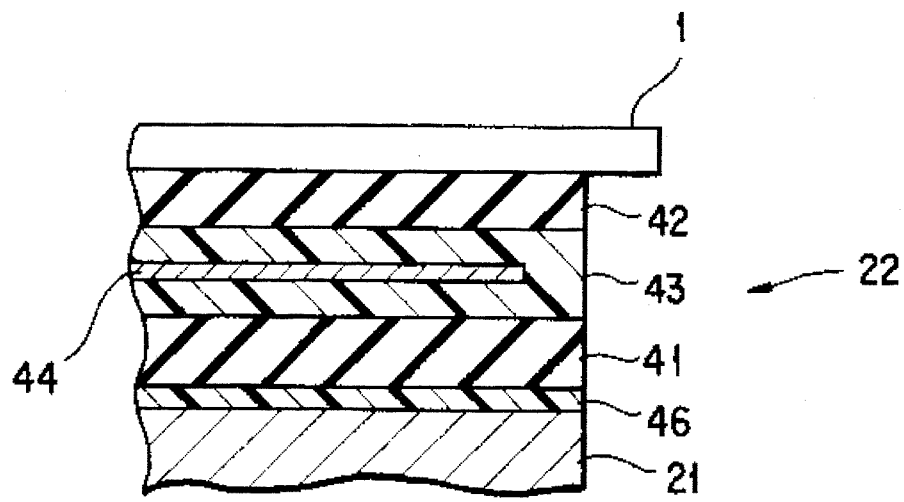
FIGS. 4 to 7 are enlarged sectional views, showing part of each of the electrostatic chucks according to other embodiments of the invention.

The electrostatic holding sheet 22 is circular to correspond to the shape of the upper surface 21a of the base member 21, and for example, as is shown FIG. 4, comprises a first insulating layer 41 provided on the side of the base member, a second insulating layer 42 provided on the wafer side and formed of an inorganic dielectric material, an organic adhesive layer 43 bonding the layers 41 and 42, and a conductive sheet 44 extending in the adhesive layer 43. The first insulating layer 41 is adhered to the base member 21 by means of another organic adhesive layer 46.

The first insulating layer 41 is made of an organic material such as polyimide, and the second insulating layer 42 is formed of an inorganic dielectric material. This dielectric material may be made of a ceramic material such as AlN, $Al_2O_3$, $SiO_2$, $TiBaO_3$, or $Si_3N_4$. The insulating layer 42 may be a crystal state or a glass state, and may be formed a sintered body or a thin film obtained by a thin-film forming technique such as CVD. The organic adhesive layers 43 and 26 are each made of an organic material having an effective adhering function, such as a thermosetting resin. Further, the conductive sheet 44 is made of a metal having a good conductivity, such as copper.

Figure 5:
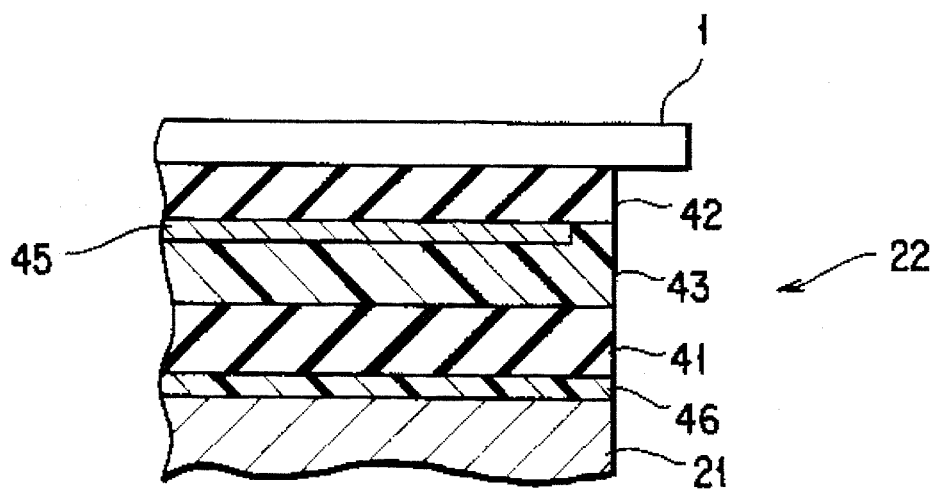
Figure 6:
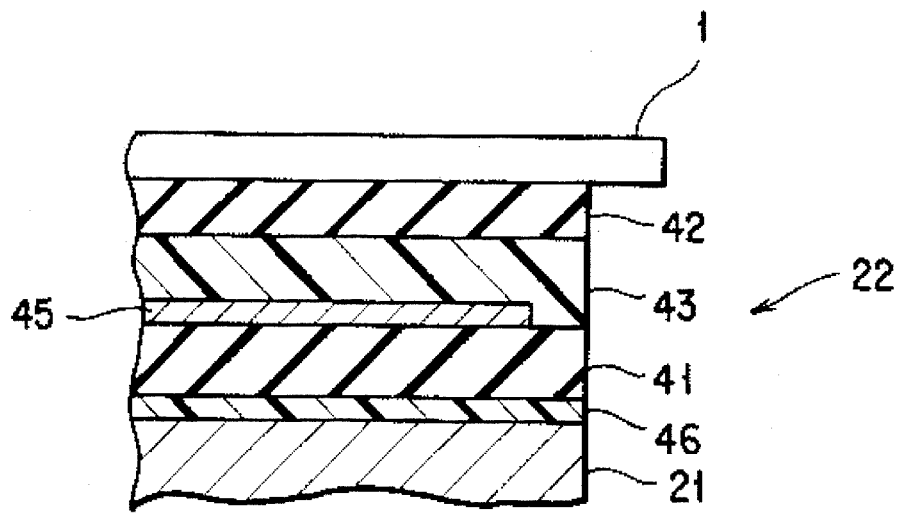

Though in the embodiment of FIG. 4, the conductive sheet 44 is inserted in the adhesive layer 43, a conductive thin film 45 having a thickness of e.g. 1 to 5 μm may be formed, instead of the insertion of the sheet 44, on the lower surface of the second insulating layer 42, as is shown in FIG. 5. Further, as is shown in FIG. 6, the conductive thin film 45 may be formed on the upper surface of the first insulating layer 41.

Figure 7:
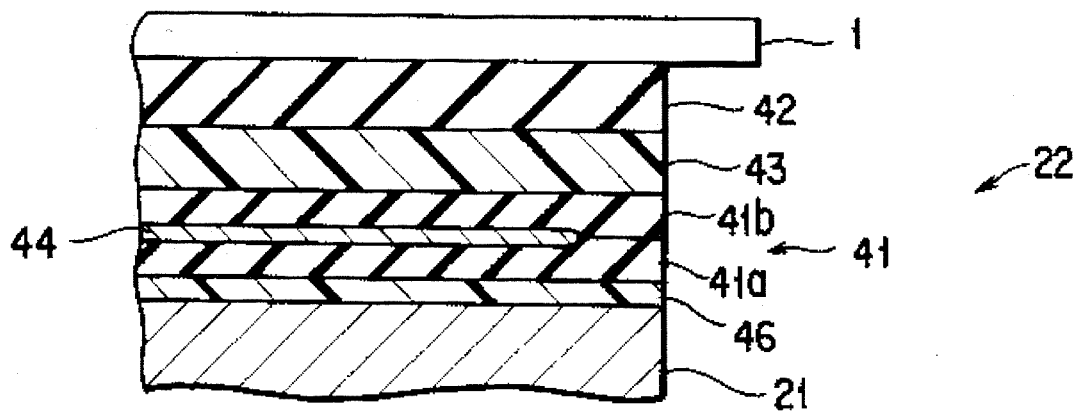

Moreover, the structure shown in FIG. 7 may be employed. In this embodiment, the first insulating layer 41 comprises a lower layer 41a and an upper layer 41b, and the conductive sheet 44 is interposed between them. The structure is advantageous in that a high insulation characteristic can be maintained between the conductive sheet 44 and wafer 1 even at a high temperature, particularly in the case where the inorganic dielectric second insulating layer 42 is made of AlN. That is, though the insulation characteristic of AlN is reduced as the temperature is reduced, the conductive sheet 44 is kept insulated since it is inserted in the first insulating layer 41 made of an organic material such as polyimide. Thus, leakage of current at a high temperature can be prevented in a reliable manner.

Figure 8:
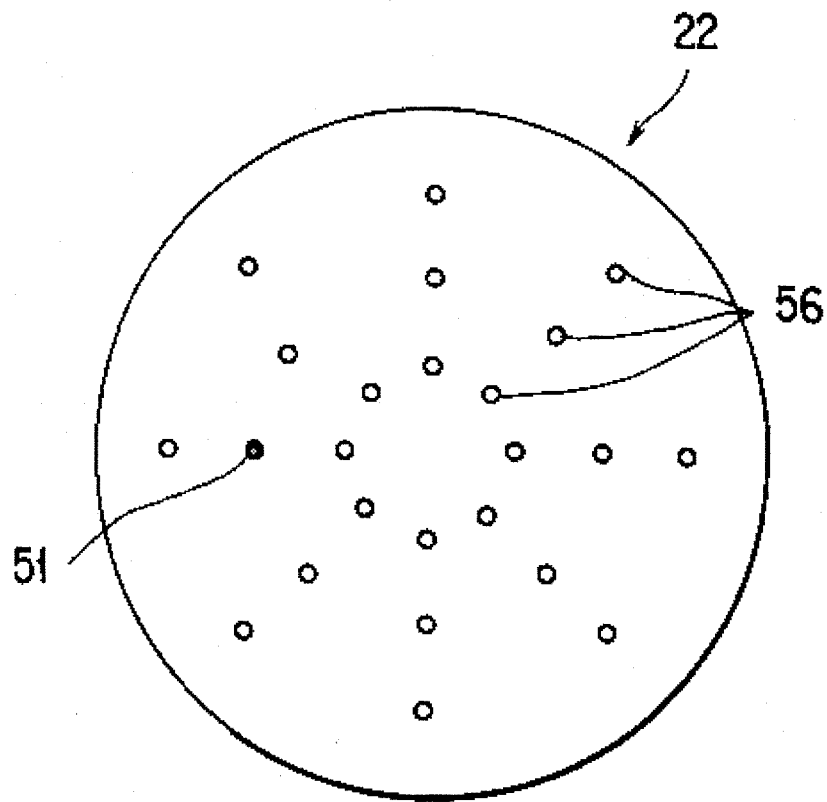
FIG. 8 is a bottom view, showing an electrostatic holding sheet.

As is shown in FIG. 8, a contact 51 for electrically connecting the electrostatic holding sheet 22 to the feeding sheet 23 is provided on the reverse side of the sheet 22. The contact 51 is formed by cutting out part of the first insulating layer 41, thereby exposing the conductive sheet 44 therethrough. The sheet 22 is provided with a plurality of gas inlets 56 extending through the sheet in the thickness direction thereof. A heat transfer gas such as He or $O_2$ is guided between the electrostatic sheet 22 and wafer 1 through the gas inlets 56 to enhance the heat conductivity therebetween.

Figure 9:
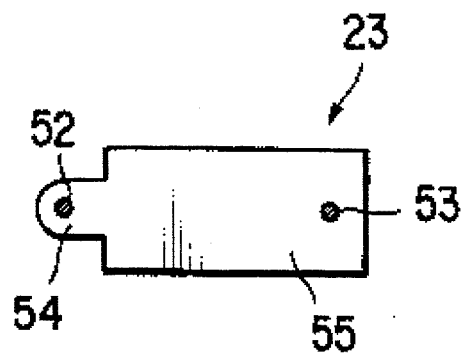
FIG. 9 is a plan view, showing a feeding sheet before it is bent.

The feeding sheet 23 has two polyimide sheets 47 serving as insulation members and a conductive sheet 48 interposed therebetween. As is shown in FIG. 9, the sheet 23 has a narrow portion 54 having a contact 52 formed therein, and a wide portion 55 having a contact 53 formed therein. In a state where the sheet 23 is mounted on the chuck, as is shown in FIG. 2, the sheet 23 comprises a vertical portion 23a, and an upper portion 23b and a lower portion 23c both extending parallel to the upper surface of the base member 21. The upper portion 23b corresponds to the narrow portion 54, while the vertical portion 23a and lower portion 23c correspond to the wide portion 55. The contacts 51 and 52 are connected to each other, and the contact 53 is connected to a line leading to the power supply 24. Further, that portion of the sheet 23 which is in the vicinity of the contact 53 is exposed to the atmosphere, so that the contact 53 and the portion near it are sealed by an O-ring so as to perform power supply in the atmosphere in which discharge phenomenon is substantially nonexistent.

The upper portion 23b (corresponding to the narrow portion 54) of the feeding sheet 23 is accommodated in the depression 61 of the base member 21 such that it is leveled with the surface 21a of the base member 21. The vertical portion 23a (corresponding to the wide portion 55) is accommodated in the slit 62. Accordingly, the sizes of the depression 61 and slit 62 are determined in accordance with the upper portion 23b and vertical portion 23a, respectively.

To mount the feeding sheet 23 as shown in FIG. 2, the wide portion 55 is inserted into the slit 62, then the narrow portion 54 is bent at right angles to the wide portion 55 to fit the portion 54 in the depression 61, and that portion of the wide portion 55 which extends out of the slit 62 is bent at right angles thereto to extend along the lower surface of the base member 21.

It is preferable to use, as the insulation material of the feeding sheet 23, a material having substantially the same thermal coefficient as the first insulation layer 41 of the electrostatic holding sheet 22.

The electrostatic holding manner of the chuck 20 constructed as above will now be explained.

The electrostatic chuck shown in FIG. 2 is a monopole type. The wafer 1 is placed on the chuck, and a high voltage is applied between the wafer 1 and conductive sheet 44, while plasma is discharged. Thus, the wafer 1 is charged with positive electricity, and the conductive sheet 44 is charged with negative electricity. The wafer 1 is attracted onto the chuck 20 by means of a coulombic force exerted between the wafer 1 and the chuck 20. In more detail, the wafer 1 is grounded by means of the ground electrode and plasma, then a high voltage of e.g. 2 kv is applied to the conductive sheet 44, and a coulombic force is exerted between the wafer 1 and sheet 44, whereby the wafer 1 is electrostatically held by the holding sheet 22. In this state, plasma etching is performed.

Since the second insulating layer 42 provided between the wafer 1 and conductive sheet 44 is made of an inorganic dielectric material, it has a good durability and a higher resistance against plasma shock than the conventional insulation layer made of polyimide. Thus, the second insulating layer 42 is not easily broken even if it is thin. Moreover, the simple process in which the second insulating layer 42 made of the inorganic dielectric is formed on the first insulating layer 41 with the adhesive layer 43 interposed therebetween, enables electrostatic chucks to be produced with a high yield and at low cost. Further, the second insulating layer 42 formed of the inorganic dielectric material enables the electrostatic chuck to have a great object-holding force, thereby facilitating the temperature control of the object.

Now, experimental results obtained by using an electrostatic holding sheet constructed as shown in FIG. 4 will be explained. In this sheet, the second insulating layer 42 is formed of an AlN sintered body, the first insulating layer 41 is made of polyimide, and the adhesive layer 43 is made of a thermosetting resin.

First, the wafer-holding force of the sheet was tested. Further, a reference electrostatic holding sheet was prepared, which employed a second insulating layer made of polyimide in place of AlN, and was tested in a manner similar to the above. Measurement results indicate that the holding force of the reference electrostatic chuck is to 40 Torr at maximum, while that of the chuck of the example is 60 Torr or more.

Then, the temperature control property of wafer 1 (5 inch wafer) was tested. A liquid which does not easily freeze such as anitifreezing fluid as a coolant was circulated through the fluid passage 29 shown in FIG. 1, and $O_2$ gas serving as thermal transfer gas was supplied between the wafer and sheet. The pressure of the thermal transfer gas was varied, thereby varying the temperature of the wafer. The temperature of a central portion of the wafer and the temperature of that peripheral portion thereof which was spaced 50 mm from the central portion were measured. Also in this case, a test similar to the above was carried out with respect to the reference electrostatic holding sheet. Measurement results show that the electrostatic chuck of the example has a cooling capacity higher than the reference one and being operable substantially independent of the $O_2$ gas pressure, and that the cooling capacity of the reference chuck depends upon the $O_2$ gas pressure, i.e., the temperature of the wafer abruptly increases when the $O_2$ gas is lower than a predetermined value.

It is considered that the above-described advantages of the invention were obtained by virtue of the increased wafer-holding force of the electrostatic holding sheet 22, i.e., the increased thermal conductivity between the wafer and sheet, owing to the second insulating layer 42 being made of AlN. This being so, a predetermined thermal conductivity can be obtained in a reliable manner without supply of $O_2$ gas. Thus, wafer-temperature control can be performed by using a second insulating layer made of AlN without using a thermal transfer gas.

Further, the temperature of the wafer 1 was measured when the RF power for generating plasma was increased.

Measurement results indicate that though the temperature of the wafer increased as the RF power increased, the rate of an increase in the temperature of a wafer treated using the electrostatic chuck of the example incorporating an AlN sheet is lower than that of an increase in the temperature of a wafer in the reference electrostatic chuck. This is due to the good heat conductivity of AlN contained in the second insulating layer. It can be understood from the above that the electrostatic chuck of the example is effective, in particular, in an apparatus using plasma.

In addition, since AlN is not easily charged with electricity as compared with polyimide, the insulation layer can be easily discharged by means of plasma ions after the wafer is removed from the chuck, and has a high shock-resistance against the plasma ions. Further, AlN itself has a higher durability than polyimide. Therefore, the electrostatic chuck employing the second insulation layer 42 made of AlN has a life longer than the conventional electrostatic chuck.

The invention is not limited to the above-described embodiments, but may be varied without departing from the scope thereof.

For example, though the embodiment is applicable to a magnetron plasma etching apparatus, it may also be applied to a plasma etching apparatus of an interelectrode discharge type, a micro-wave radiation type, etc. Moreover, the invention is applicable to devices other than plasma etching apparatus, such as an ECR etcher, a plasma CVD device, a wafer prober, etc., if they need to electrostatically hold a plate-like object such as a wafer. Furthermore, the invention is not limited to an electrostatic chuck capable of controlling the temperature of an object, and is also applicable to an electrostatic chuck of a type other than a mono-pole type.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An electrostatic chuck device for holding an object with the use of a coulombic force, comprising:

a base member;

an electrostatic holding sheet provided on the base member, and comprising a first insulating layer formed on the base member side, a second insulating layer made of an inorganic dielectric material and formed on the object side, an electrode provided between the first and second insulating layers, and an adhesive layer made of an organic material for adhering the first insulating layer to the second insulating material;

power supply means for applying a voltage between the electrode and the object; and feeding means for feeding power from the power supply means to the electrode;

wherein the object is placed on the second insulating layer, and a voltage is applied between the object and the electrode, thereby creating static electricity and hence a coulombic force for holding the object on the second insulating layer, and the electrostatic holding sheet has a gas inlet extending from the upper surface of the electrostatic holding sheet to the lower surface thereof, and a gas for transferring heat is guided between the object and the electrostatic holding sheet through the gas inlet.

2. The electrostatic chuck according to claim 1 wherein said chuck is in a plasma atmosphere.

3. An electrostatic chuck device for holding an object with the use of a coulombic force, comprising:

a base member;

an electrostatic holding sheet provided on the base member, and comprising a first insulating layer formed on the base member side, a second insulating layer made of an inorganic dielectric material and formed on the object side, an electrode provided in the first insulating layer, and an adhesive layer made of an organic material for adhering the first insulating layer to the second insulating layer;

power supply means for applying a voltage between the electrode and the object; and feeding means for feeding power from the power supply means to the electrode;

wherein the object is placed on the second insulating layer, and a voltage is applied between the object and the electrode, thereby creating static electricity and hence a coulombic force for holding the object on the second insulating layer, the electrostatic holding sheet having a gas inlet extending from the upper surface of the electrostatic holding sheet to the lower surface thereof, and a gas for transferring heat is guided between the object and the electrostatic holding sheet through the gas inlet.

4. The electrostatic chuck according to claim 3 wherein said chuck is in a plasma atmosphere.

* * * * *